| (12) | United States Patent | (10) Patent No.: | US 11,431,302 B2 |
|---|---|---|---|
| | Dong | (45) Date of Patent: | Aug. 30, 2022 |

(54) ISOLATION CIRCUIT

(71) Applicant: 2Pai Semiconductor Co., Limited, Shanghai (CN)

(72) Inventor: Zhiwei Dong, Shanghai (CN)

(73) Assignee: 2PAI SEMICONDUCTOR CO., LTD., Shanghai (CN)

( * ) Notice: Subject to any disclaimer, the term of this patent is extended or adjusted under 35 U.S.C. 154(b) by 39 days.

(21) Appl. No.: 17/025,565

(22) Filed: Sep. 18, 2020

(65) Prior Publication Data

US 2021/0021241 A1  Jan. 21, 2021

Related U.S. Application Data

(63) Continuation of application No. 15/990,571, filed on May 25, 2018, now Pat. No. 10,812,027.

(30) Foreign Application Priority Data

May 26, 2017 (CN) .......................... 201710386724.8
Jul. 10, 2017 (CN) .......................... 201710558211.0

(51) Int. Cl.

| H03F 1/32 | (2006.01) |
|---|---|
| H03F 3/08 | (2006.01) |
| H03K 19/0175 | (2006.01) |
| H03F 3/45 | (2006.01) |
| H01G 4/38 | (2006.01) |
| H03F 3/387 | (2006.01) |

(52) U.S. Cl.
CPC ............. *H03F 3/085* (2013.01); *H01G 4/38* (2013.01); *H03F 3/387* (2013.01); *H03F 3/45475* (2013.01); *H03F 3/45928* (2013.01); *H03K 19/017545* (2013.01); *H03F 2200/271* (2013.01); *H03F 2200/273* (2013.01); *H03F 2200/537* (2013.01)

(58) Field of Classification Search
CPC ..................................................... H03F 1/3288
USPC ..................................................... 330/59, 152
See application file for complete search history.

(56) References Cited

U.S. PATENT DOCUMENTS

| 4,202,354 A | 5/1980 | Smith et al. |
|---|---|---|
| 4,686,617 A | 8/1987 | Colton |
| 6,426,680 B1 | 7/2002 | Duncan et al. |
| 6,657,420 B1 * | 12/2003 | Shacter .................. G05F 1/575 |
| | | 323/288 |
| 7,035,611 B2 | 4/2006 | Garlepp et al. |

(Continued)

OTHER PUBLICATIONS

U.S. Appl. No. 15/990,571, filed May 25, 2018, 54 pages.

(Continued)

*Primary Examiner* — Henry Choe
(74) *Attorney, Agent, or Firm* — Adsero IP

(57) ABSTRACT

An isolation circuit and a method for providing isolation between two dies are provided. The isolation circuit includes: an isolation module, configured to generate an isolation signal based on an input signal from a first die and to provide isolation between the first die and a second die, where the isolation signal is smaller than the input signal in amplitude, and the first die is coupled with the second die; a latch module, configured to latch the isolation signal at a certain level and output a latched signal; an amplifier module, configured to amplify the latched signal. In the isolation circuit, a modulation module and a demodulation module can be saved.

18 Claims, 12 Drawing Sheets

(56) References Cited

U.S. PATENT DOCUMENTS

| | | | |
|---|---|---|---|
| 7,893,731 B2* | 2/2011 | Peterson | H03K 19/018521 |
| | | | 327/108 |
| 9,041,467 B2 | 5/2015 | Sutardja et al. | |
| 9,154,089 B2 | 10/2015 | Lee | |
| 10,812,027 B2 | 10/2020 | Dong | |
| 11,165,430 B1* | 11/2021 | Manipatruni | H03K 19/23 |
| 2018/0342989 A1 | 11/2018 | Dong | |

OTHER PUBLICATIONS

U.S. Appl. No. 15/990,571 Non-Final Office Action, dated May 23, 2019, 12 pages.
U.S. Appl. No. 15/990,571 Non-Final Office Action, dated Sep. 13, 2019, 9 pages.
U.S. Appl. No. 15/990,571 Non-Final Office Action, dated Jan. 3, 2020, 8 pages.
U.S. Appl. No. 15/990,571 Final Office Action, dated Apr. 15, 2020, 8 pages.
U.S. Appl. No. 15/990,571 Notice of Allowance, dated Jul. 1, 2020, 14 pages.

* cited by examiner

ISOLATION CIRCUIT

CROSS-REFERENCE TO RELATED APPLICATIONS

This application is a continuation of U.S. application Ser. No. 15/990,571 which was filed on May 25, 2018, and claims the benefit of priority to Chinese Patent Application No. 201710386724.8, filed on May 26, 2017, and Chinese Patent Application No. 201710558211.0, filed on Jul. 10, 2017, the entire disclosure of which are incorporated herein by reference.

TECHNICAL FIELD

The disclosure generally relates to a high voltage circuit field, and more particularly, to an isolation circuit.

BACKGROUND

An optocoupler is a device to transmit signals via a medium of light. Usually, the light emitter and the receiver (photosensitive semiconductor tube) are packaged in a same chip. When an input terminal of the optocoupler receives a current signal, the light is emitted from the light emitter. After the light is received by the receiver, a photocurrent is generated and output from an output terminal of the optocoupler. Therefore, a "electrical-optical-electrical" conversion is achieved. In the optocoupler, signals are coupled from an input terminal to an output terminal via the medium of light. The optocoupler is a technology that has been used for more than 50 years. For the first time, the optocoupler realizes signal isolation by a single device, and it is widely used in power control circuits.

However, the optocoupler has some drawbacks. Because electrical properties of a light-emitting diode vary with temperature, and electrical performances of the optocoupler vary with temperature and are unstable. In addition, the optocoupler also has a performance degradation issue because of the aging of the light-emitting diode and isolated plastics. Further, the optocoupler also has a low common-mode rejection ratio because of a parasitic capacitance between the light-emitting diode and a receiving circuit. When there is a large common-mode voltage change on both sides (e.g. 30 kV/us), the light-emitting diode wrongly emits light due to a parasitic capacitance current. Finally, according to principles, the optocoupler also has some drawbacks such as low speed, high power cost, and not easy integration.

SUMMARY

Embodiments of the present disclosure provide an isolation circuit, which includes: an isolation module, configured to generate an isolation signal based on an input signal from a first die and to provide isolation between the first die and a second die, where the isolation signal is smaller than the input signal in amplitude; a latch module, configured to latch the isolation signal at a certain level and output a latched signal; and an amplifier module, configured to amplify the latched signal.

In some embodiment, the isolation circuit further includes: a buffer module, configured to perform a filtering on the input signal before which is transmitted to the isolation module.

In some embodiment, the isolation module includes a primary isolation branch including a primary isolation capacitor and a first division capacitor in series, where a voltage on the first division capacitor is output to the latch module.

In some embodiment, the primary isolation capacitor is disposed on the first die or/and the second die.

In some embodiment, a capacitance ratio between the primary isolation capacitor and the first division capacitor is from 1:0 to 1:1000.

In some embodiment, a capacitance ratio between the primary isolation capacitor and the first division capacitor is 1:100.

In some embodiment, the primary isolation capacitor includes a first primary isolation capacitor and a second primary isolation capacitor in series; and wherein the first primary isolation capacitor and a second primary isolation capacitor are disposed in different dies.

In some embodiment, the first primary isolation capacitor and the second primary isolation capacitor have a same capacitance value.

In some embodiment, the isolation module further includes a common mode branch to reduce a common mode noise on the first die and the second die, and to output a common mode signal to the latch module.

In some embodiment, the common mode branch includes an auxiliary isolation capacitor and a second division capacitor in series; and a first plate of the auxiliary isolation capacitor is coupled with a ground signal of the first die, a first plate of the first division capacitor and a first plate of the second division capacitor coupled with a ground signal of the second die, and a second plate of the second division capacitor is coupled with the latch module.

In some embodiment, a capacitance ratio between the primary isolation capacitor and the first division capacitor is equal to a capacitance ratio between the auxiliary isolation capacitor and the corresponding second division capacitor.

In some embodiment, the isolation circuit further includes: an inverter, configured to output an inverted input signal to the common mode branch; wherein the common mode branch includes an auxiliary isolation capacitor and a second division capacitor in series; and a first plate of the auxiliary isolation capacitor is coupled with the inverted input signal, a first plate of the first division capacitor and a first plate of the second division capacitor coupled with a ground signal of the second die, and a second plate of the second division capacitor is coupled with the latch module.

In some embodiment, a capacitance ratio between the primary isolation capacitor and the first division capacitor is equal to a capacitance ratio between the auxiliary isolation capacitor and the corresponding second division capacitor.

In some embodiment, the primary isolation capacitor includes a first primary isolation capacitor and a second primary isolation capacitor in series; and the auxiliary isolation capacitor includes a first auxiliary isolation capacitor and a second auxiliary isolation capacitor in series; and the first primary isolation capacitor and the second primary isolation capacitor are disposed in different die, and the first auxiliary isolation capacitor and the second auxiliary isolation capacitor are disposed in different die.

In some embodiment, the first primary isolation capacitor and the second primary isolation capacitor have a same capacitance value; and the first auxiliary isolation capacitor and the second auxiliary isolation capacitor have a same capacitance value.

In some embodiment, the isolation module includes two or more primary isolation branches, each of which includes a primary isolation capacitor and a first division capacitor in series; the latch module includes two or more latches, corresponding to the two or more primary isolation branches respectively; the amplifier module includes two or more amplifiers, corresponding to the two or more latches respectively; and the buffer module includes two or more buffers, corresponding to the two or more primary isolation branches respectively.

In some embodiment, the isolation module further includes a common mode branch to reduce a common mode noise on the first die and the second die, and to output a common mode signal to each of the two or more latches correspondingly.

In some embodiment, the common mode branch includes an auxiliary isolation capacitor and a second division capacitor in series; and a first plate of the auxiliary isolation capacitor is coupled with a ground signal of the first die, a first plate of each of the two or more first division capacitors and a first plate of the second division capacitor are coupled with a ground signal of the second die, and a second plate of the second division capacitor is coupled with an input terminal of each of the two or more latches correspondingly.

In some embodiment, capacitance ratios between the primary isolation capacitors and the corresponding division capacitors in the two or more primary isolation branches are equal to a capacitance ratio between the auxiliary isolation capacitor and the corresponding second division capacitor.

In some embodiment, the primary isolation capacitors in the two or more primary isolation branches and the auxiliary isolation capacitor have a same capacitance value; and the first division capacitors in the two or more primary isolation branches and the second division capacitor have a same capacitance value.

In some embodiment, the isolation module includes a primary isolation branch including a first inductor and a second inductor; the first inductor includes a first terminal to receive the input signal, and a second terminal coupled with a fixed voltage; and a second inductor, having a first terminal to output the isolated signal to the latch module, and a second terminal coupled with the fixed voltage.

In some embodiment, the isolation module further includes a common mode branch to reduce a common mode noise, and to output a common mode signal to the latch module.

In some embodiment, the common mode branch includes: a third inductor, having a first terminal to receive the ground signal of the first die, and a second terminal coupled with the fixed voltage; and a fourth inductor, having a first terminal to output a common mode signal to the latch module, and a second terminal coupled with the fixed voltage.

In some embodiment, the isolation circuit further includes: an inverter, configured to invert an input signal to an inverted input signal and output the inverted input signal to the common mode branch; and the common mode branch includes: a third inductor, having a first terminal to receive the inverted input signal, and a second terminal coupled with the fixed voltage; and a fourth inductor, having a first terminal to output a common mode signal to the latch module, and a second terminal coupled with the fixed voltage.

In some embodiment, the latch module includes at least one latch, each of which has a flipping voltage 10 mV~60 mV or a flipping current at 30 uA~1 mA.

Embodiments of the present disclosure provide a method for providing isolation between two dies, which includes: generating an isolation signal based on an input signal from a first die and providing isolation between the first die and a second die, wherein the isolation signal is smaller than the input signal in amplitude; latching the isolation signal at a certain level to form a latched signal; and amplifying the latched signal.

In some embodiment, the method further includes: filtering the input signal before the isolation voltage is generated.

Compared with the conventional technology, the present invention has the following benefits.

The isolation circuit includes a latch module, which has at least one latch, a modulation module and a demodulation module in the conventional technology can be saved. Accordingly, the chip size can be reduced, the transmitting speed can be improved and the noise and delay performance can also improved.

Further, the isolation module includes a common mode branch to provide a differential input to the at least one latch, so that a common mode noise of substrate could be reduced and a common mode rejection ratio may be increased.

Further, the isolation circuit includes an inverter, which provides an inverted input signal to the common mode module. Therefore, a signal-to-noise ratio of the isolation circuit can be improved.

Further, the latch has a small flipping voltage, thus, the latch can recognize digital signals with small amplitudes. So that even a small signal difference can be recognized. Therefore, the primary isolation capacitor can be manufactured in a small value with a thick dielectric, an isolation between two dies with high voltage difference can be achieved.

DETAILED DESCRIPTION

Figure 1:
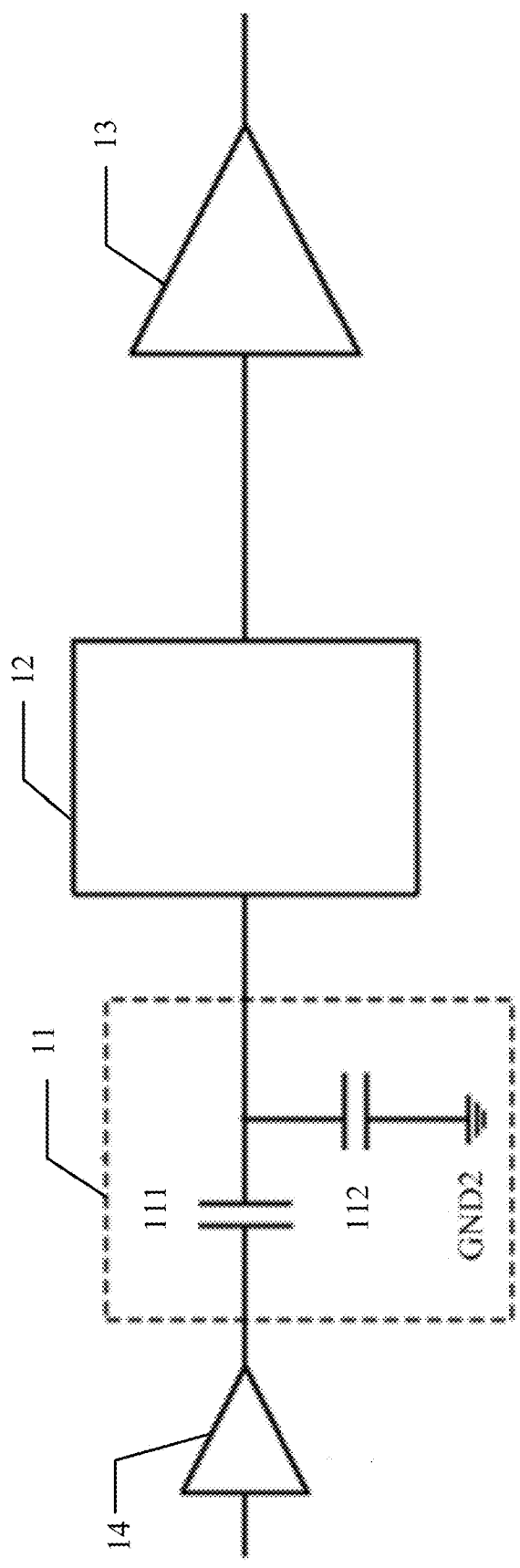
FIG. 1 schematically illustrates a diagram of an isolation circuit according to an embodiment of the present disclosure.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosures.

Referring to FIG. 1, FIG. 1 schematically illustrates a diagram of an isolation circuit according to an embodiment of the present disclosure. As shown in FIG. 1, the isolation circuit includes an isolation module including a primary isolation branch 11, a latch 12, an amplifier 13, and a buffer 14. Specifically, the primary isolation branch 11 includes a primary isolation capacitor 111 and a first division capacitor 112 in series.

In some embodiment, the isolation module is configured to generate an isolation signal based on an input signal from a first die and to provide isolation between the first die and the second die.

In some embodiments, the primary isolation capacitor 111 in the primary isolation branch 11 includes a first plate to receive an input signal, and a second plate coupled with a first input terminal of the latch 12. The first division capacitor 112 includes a first plate to receive a ground signal of the second die GND2, and a second plate coupled with the second plate of the primary isolation capacitor 111 and the first input terminal of the latch 12, where a voltage on the first division capacitor (isolation signal) is output to a first input terminal of the latch 12. Therefore, the isolation signal is smaller than the input signal in amplitude. In addition, an output terminal of the latch 12 is coupled with an input terminal of the amplifier 13. The primary isolation capacitor 111 acts a role of isolating voltage between the first die and the second die, an isolation voltage has a huge range. In some embodiment, the isolation voltage maybe high to 20,000V.

In some embodiment, the primary isolation capacitor 111 may be disposed in the first die, or be disposed on the second die. In some embodiment, a portion of the primary isolation capacitor 111 may be disposed on the first die and another portion of the primary isolation capacitor 111 may be disposed on the second die. The flexible location of the primary isolation capacitor 111 is beneficial to the design of the isolation circuit and isolation voltage.

In some embodiments, the primary isolation capacitor 111 and the first division capacitor 112 both may have very low capacitance values at a femtofarad (fF) level, and the isolation circuit generally has a leakage current. In a situation where the leakage current is in a picoampere (pA) level, capacitors can maintain a voltage at a certain level for a millisecond level. Therefore, the isolation signal output from the primary isolation branch 11 cannot be maintained when the input signal remains stable, thereby causing negative effects on the isolation.

Therefore, there is a need to stabilize the isolation signal output from the primary isolation capacitor 111 so that an output signal from the amplifier 13 remains stable. Accordingly, the latch 12 is required to latch the isolation signal at a certain level and outputs a latched signal.

In some embodiment, the latch 12 may have a small flipping voltage to recognize digital signals with small amplitude differences. So that even a small signal difference can be recognized. Therefore, the primary isolation capacitor 111 can be manufactured in a small value with a thick dielectric, an isolation between two dies with high voltage difference can be achieved. In some embodiment, the latch 12 is a voltage latch.

The amplifier 13 is configured to amplify the latched signal. In some embodiment, the amplifier 13 amplifies the latched signal back to the original quantity of the input signal.

In some embodiment, before the input signal is transmitted to the isolation module, the input signal may be filtered. As shown in FIG. 1, the buffer 14 includes an input terminal to receive the input signal from a circuit, such as an application circuit on the first die, and an output terminal is coupled with the first plate of the primary isolation capacitor 111. The buffer 14 may be disposed in a first die. It should be noted that, the buffer 14 is not a compulsory component in the isolation circuit.

Figure 2:
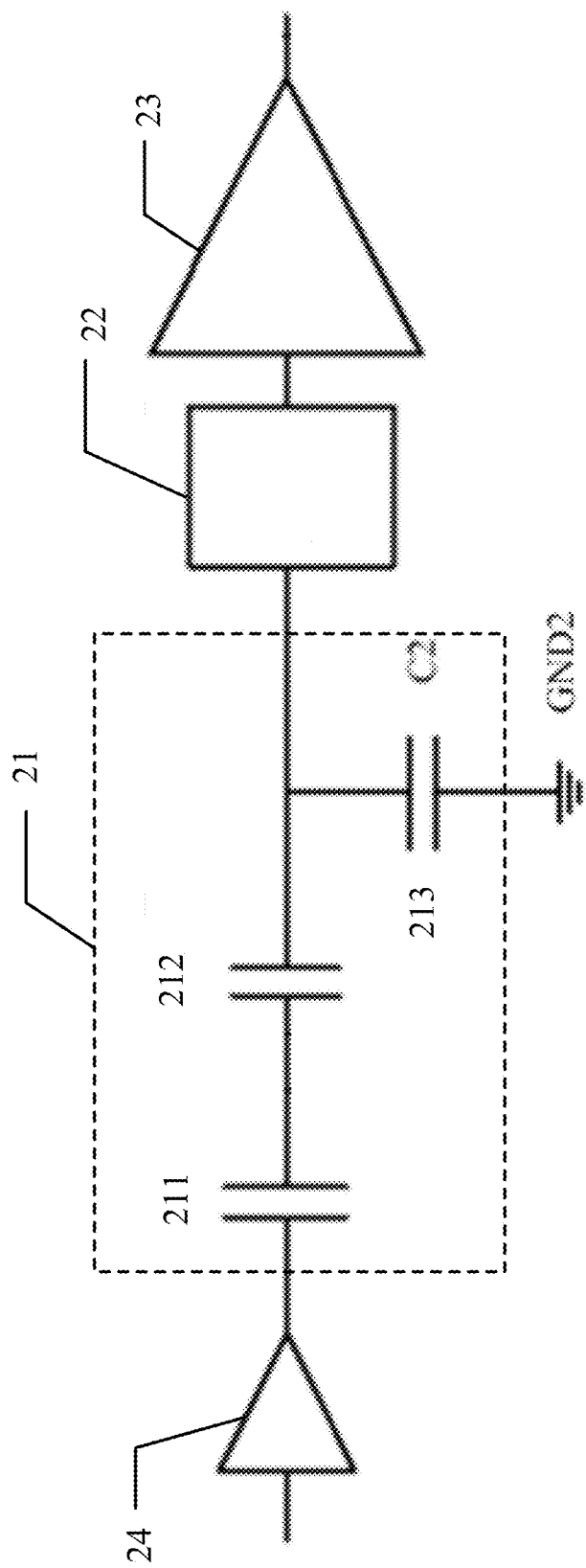
FIG. 2 schematically illustrates a diagram of an isolation circuit according to another embodiment of the present disclosure.

Referring to FIG. 2, FIG. 2 schematically illustrates a diagram of an isolation circuit according to another embodiment of the present disclosure. The isolation circuit includes an isolation module including a primary isolation branch 21, a latch 22, an amplifier 23 and a buffer 24. The primary isolation branch 21 includes a first division capacitor 213.

The main difference from the isolation circuit as shown in FIG. 1 lies in that a first primary isolation capacitor 211 and a second primary isolation capacitor 212 in series constitute a primary isolation capacitor in FIG. 2. Other components are similar to the isolation circuit as shown in FIG. 1 and are not described in detail hereinafter.

In some embodiment, the first primary isolation capacitor 211 and a second primary isolation capacitor 212 are disposed in different dies. For example, the first primary isolation capacitor 211 may be disposed on the first die, and the second primary isolation capacitor 212 may be disposed on the second die. By disposing the first isolation capacitor 211 on the first die and the second isolation capacitor 212 on the second die, the isolation circuit could have a higher isolation voltage and the isolation circuit can be designed with a more flexibility.

In some embodiment, the first primary isolation capacitor 211 and the second primary isolation capacitor 212 may have a same capacitance value.

Generally, a common mode noise exists between the first die and the second die, and the common mode noise is generally indistinguishable from a desired signal. When the common mode noise increases significantly, for example, when it reaches a certain proportion of the desired signal or reaches the same level as the desired signal (for example, 100V/ns), the noise signal may have a significant effect on the desired signal, and may result in problems such as signal distortion or loss. A differential input circuitry may be introduced to reduce the common mode noise according to an embodiment of this disclosure.

Figure 3:
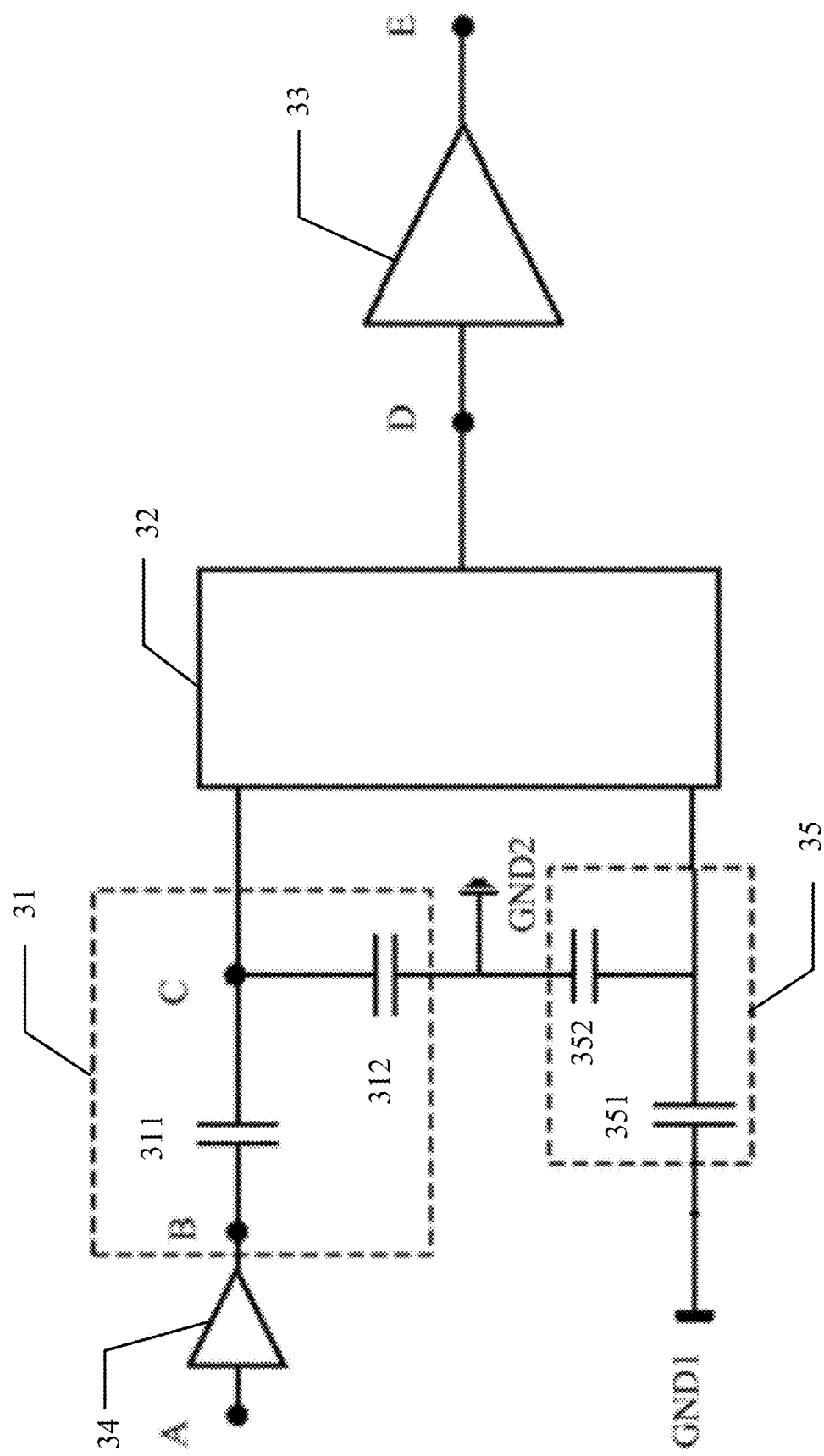
FIG. 3 schematically illustrates a diagram of an isolation circuit according to another embodiment of the present disclosure.

Referring to FIG. 3, FIG. 3 schematically illustrates a diagram of an isolation circuit according to another embodiment of the present disclosure. The isolation circuit includes: an isolation module including a primary isolation branch 31 and a common mode branch 35, a latch 32, an amplifier 33 and a buffer 34. The amplifier 33 and the buffer 34 are similar to above circuits and are not described in detail hereinafter. The primary isolation branch 11 includes a primary isolation capacitor 311 and a first division capacitor 312 in series. The common mode branch 35 is coupled to the latch 32 to output a common mode signal to a second input terminal of the latch 32, and to reduce a common mode noise on the first die and the second die.

In some embodiment, the common mode branch 21 includes an auxiliary isolation capacitor 351 and a second division capacitor 352 in series. Specifically, a first plate of the auxiliary isolation capacitor 351 is coupled with a ground signal GND1 of the first die, a first plate of the first division capacitor 312 and a first plate of the second division capacitor 352 coupled with the ground signal GND2 of the second die, and a second plate of the second division capacitor 352 is coupled with the second input terminal of the latch 32.

As shown in FIG. 3, the first plate of the auxiliary isolation capacitor 351 is coupled with the ground signal GND1 of the first die, so that the latch 32 may receive the common mode signal to reduce the common mode noise and increase a common mode rejection ratio in the isolation circuit.

Figure 4:
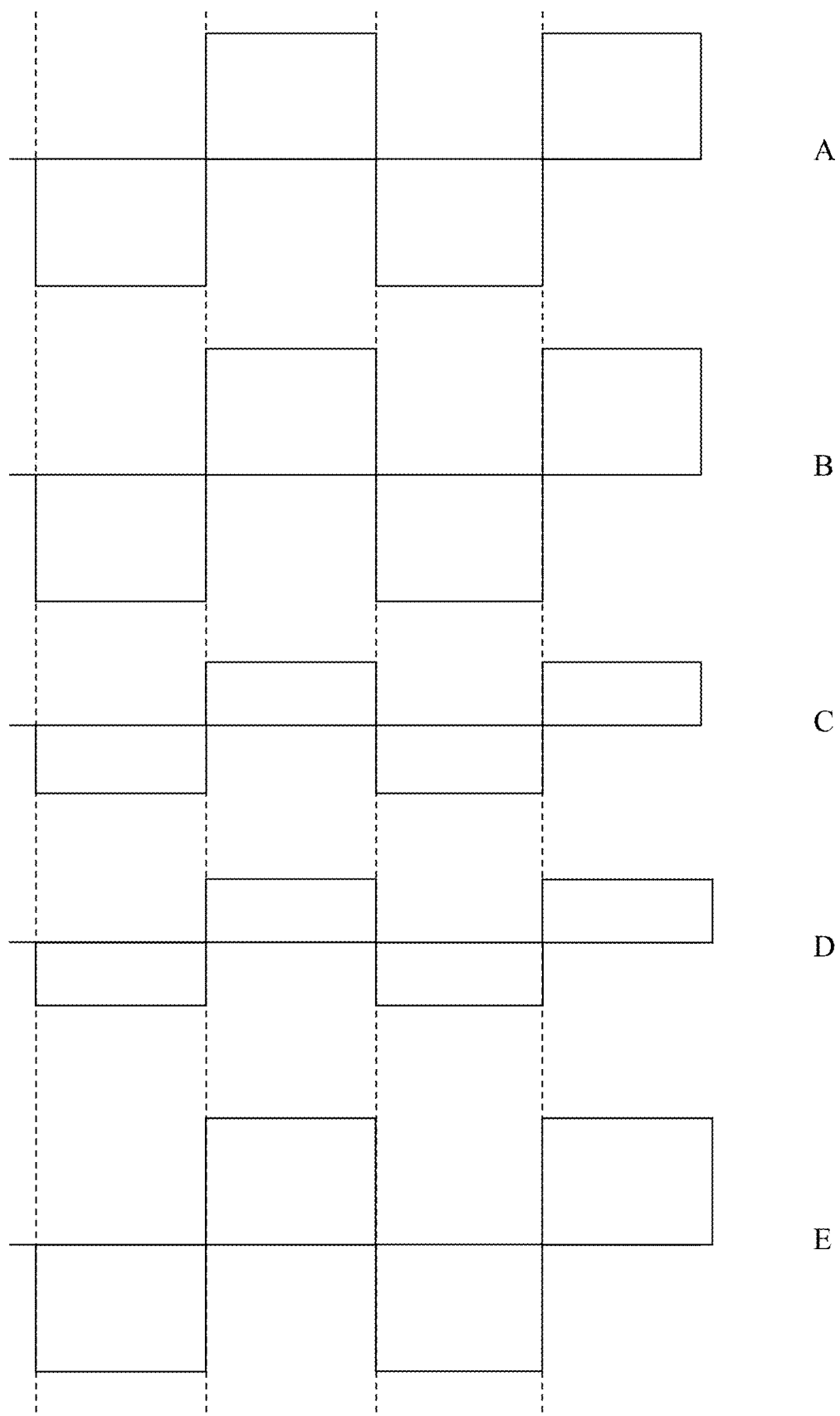
FIG. 4 schematically illustrates a timing diagram of the isolation circuit shown in FIG. 3.

FIG. 4 schematically illustrates a timing diagram of the isolation circuit shown in FIG. 3. As shown in FIG. 3 and FIG. 4, a waveform A, B, C, D and E in FIG. 4 represents a signal at node A, B, C, D and E in FIG. 3 respectively.

If an input signal level is VDD and capacitance values of the primary isolation capacitor 311 and the first division capacitor 312 are denoted by C1 and C2 respectively, a level of the isolation signal at anode C is $C1/(C1+C2)*VDD$. In addition, a latched signal level at a node D may also be $C1/(C1+C2)*VDD$ due to the presence of the latch 32. However, in some embodiment, the level at the node D may have a certain amplification with respect to the level at the node C, for example, the level at the node D may be 2-3 times as high as the level at the node C. Finally, after the latched signal is amplified by the amplifier 33, a level at a node E may have a same amplitude with the level at the node A, or the latched signal is amplified to a required level for further processing.

Figure 5:
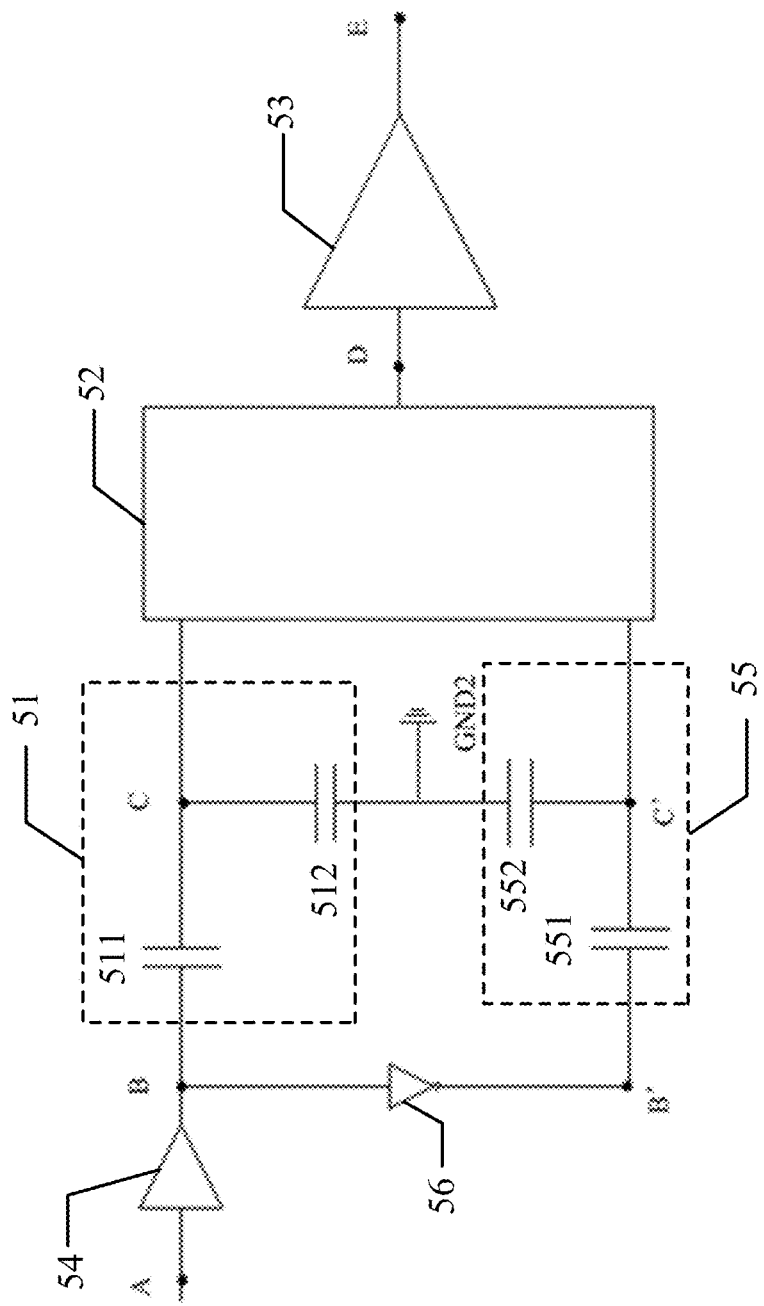
FIG. 5 schematically illustrates a diagram of an isolation circuit according to another embodiment of the present disclosure.

Referring to FIG. 5, FIG. 5 schematically illustrates a diagram of an isolation circuit according to another embodiment of the present disclosure. The isolation circuit includes an isolation module including a primary isolation branch 51 and a common mode branch 55, a latch 52, an amplifier 53, a buffer 54, and an inverter 56. The isolation module includes a primary isolation branch 51 including a primary isolation capacitor 511 and a first division capacitor 512 in series.

The primary isolation branch 51, the latch 52, the amplifier 53, and the buffer 54 are similar to above circuits and are not described in detail hereinafter. A common mode branch 55 includes an auxiliary isolation capacitor 551 and a second division capacitor 552 in series, and the inverter 56 ensures that a signal in a first input terminal INPUT1 and a signal in a second input terminal INPUT2 are opposite in phase. In some embodiment, the inverter 56 is disposed in the first die.

In some embodiment, the inverter 56 outputs an inverted input signal to the common mode branch 55. A first plate of the auxiliary isolation capacitor 551 is coupled with the inverted input signal, a first plate of the first division capacitor 512 and a first plate of the second division capacitor 552 coupled with a ground signal of the second die GND2, and a second plate of the second division capacitor 552 is coupled with the second input terminal of the latch 52.

In some embodiment, the inverter 56 includes an input terminal coupled with a first plate of the primary isolation capacitor 511, and an output terminal coupled with a first plate of the auxiliary isolation capacitor 551. Further, the input terminal of the inverter 56 may be coupled with the first plate of the auxiliary isolation capacitor 551, and the output terminal of the inverter 56 may be coupled with the first plate of the primary isolation capacitor 511.

In some embodiments, the primary isolation capacitor 511 and the auxiliary isolation capacitor 551 may have various arrangements. In some embodiments, at least one of the primary isolation capacitor 511 and the auxiliary isolation capacitor 551 is disposed in the first die or the second die. For example, the primary isolation capacitor 511 and the auxiliary isolation capacitor 551 are disposed in the first die; or, the primary isolation capacitor 511 and the auxiliary isolation capacitor 551 are disposed in the second die; or, the primary isolation capacitor 511 is disposed in the first die and the auxiliary isolation capacitor 551 is disposed in the second die; or, the primary isolation capacitor 511 is disposed in the second die and the auxiliary isolation capacitor 551 is disposed in the first die.

In some embodiment, if capacitance values of the primary isolation capacitor 511, the first division capacitor 512, the auxiliary isolation capacitor 551 and the second division capacitor 552 are denoted by C1, C2, C3 and C4 respectively, a capacitance ratio between the primary isolation capacitor 511 and the first division capacitor 512 is equal to a capacitance ratio between the auxiliary isolation capacitor 551 and the corresponding second division capacitor 552 (i.e. C1:C2=C3:C4).

In some embodiment, the primary isolation capacitor 511 and the auxiliary isolation capacitor 551 have a same capacitance value; the first division capacitor 512 and the second division capacitor 552 have a same capacitance value (i.e. C1=C3; C2=C4), which are beneficial to mass production, procurement of components and reduction of system cost. A system may be stable due to the same value between capacitors.

Figure 6:
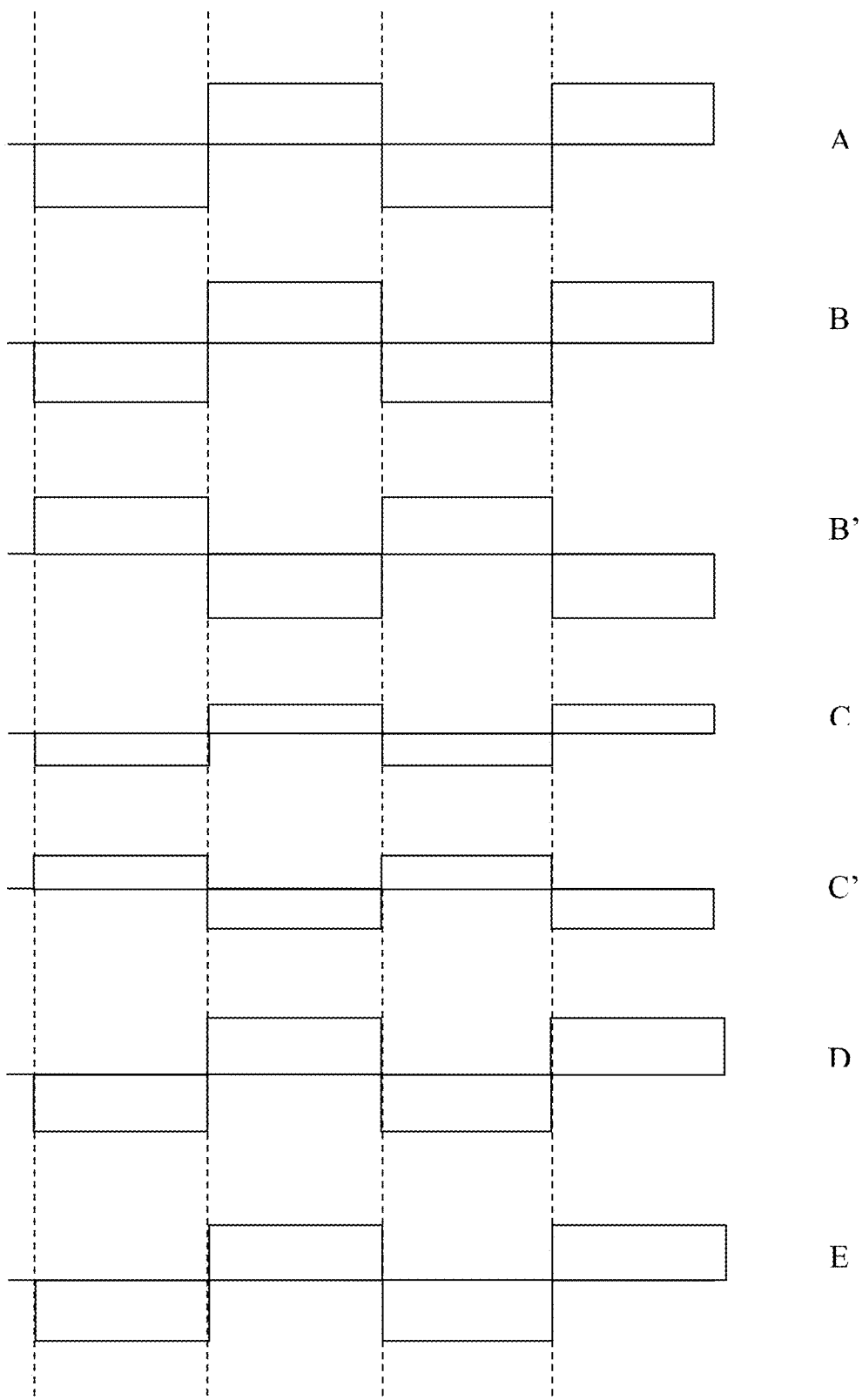
FIG. 6 schematically illustrates a timing diagram of the isolation circuit shown in FIG. 5.

Referring to FIG. 6, FIG. 6 schematically illustrates a timing diagram of the isolation circuit shown in FIG. 5. As shown in FIG. 5 and FIG. 6, a waveform A, B, C, D and E in FIG. 6 represents a signal at node A, B, C, D and E in FIG. 5 respectively. If a level of the input signal at a node A is VDD, a level of the isolation signal at a node C is $C1/(C1+C2)*VDD$. The input signal at a node B has an opposite phase with the inverted signal at a node B' due to the inverter INV. So that a level at a node C' is $-C3/(C3+C4)*VDD$. Therefore, a level at a node D is $C1/(C1+C2)*VDD+C3/(C3+C4)*VDD$. In some embodiment, the level at the node D may have a certain amplification with respect to the level at the node C, for example, the level at the node D may be 3 times as high as the level at the node C. After the latched signal is amplified by the amplifier 53, a level at a node E may have a same amplitude with the level at node A, or the latched signal is amplified to a required level for further processing.

In some embodiment, capacitance values of the first division capacitor 512 and the second division capacitor 552 may be 0, that is, the second plate of the primary isolation capacitor 511 and the second plate of the auxiliary isolation capacitor 551 does not receive the ground signal from the second chip. However, in practice, parasitic capacitance also occurs when the connection is disconnected. In some embodiment, capacitance values of the first division capacitor 512 and the second division capacitor 552 may also be infinitely close to zero, and it is not meant to be limiting. The first division capacitor 512 and the second division capacitor 552 may also be a combination of an input capacitance of the circuit and other capacitance such as a parasitic capacitance.

In some embodiment, a capacitance ratio between the primary isolation capacitor 511 and the first division capacitor 512 and a capacitance ratio between the auxiliary isolation capacitor 551 and the corresponding second division capacitor 552 may be C1:C2=C3:C4=1:0. In practice, a large capacitance value of the primary isolation capacitor 511 and the auxiliary isolation capacitor 551 increases the cost. In some embodiment, a capacitance ratio between the primary isolation capacitor 511 and the first division capacitor 512 is from 1:0 to 1:1000, such as 1:10, 1:30, 1:50, 1:150, 1:200 or the other like. In some embodiment, a capacitance ratio between the primary isolation capacitor 511 and the first division capacitor 512 is 1:100.

Figure 7:
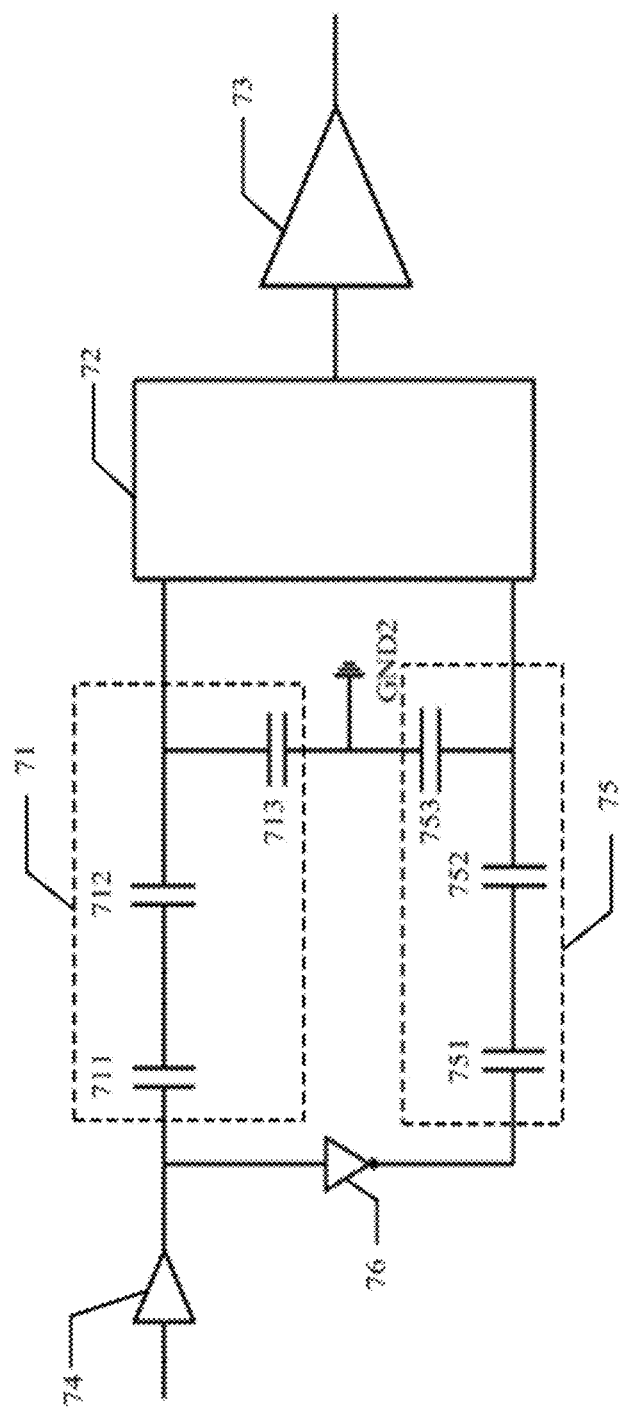
FIG. 7 schematically illustrates a diagram of an isolation circuit according to another embodiment of the present disclosure.

Referring to FIG. 7, FIG. 7 schematically illustrates a diagram of an isolation circuit according to another embodiment of the present disclosure. The isolation circuit includes: an isolation module includes a primary isolation branch 71 and a common mode branch 75, a latch 72, an amplifier 73, a buffer 74 and an inverter 76. The primary isolation branch 71 includes a first division capacitor 713 and the common mode branch 75 includes a second division capacitor 753.

The main difference from the isolation circuit as shown in FIG. 5 lies in that a first primary isolation capacitor 711 and a second primary isolation capacitor 712 in series constitute a primary isolation capacitor, a first auxiliary isolation capacitor 751 and a second auxiliary isolation capacitor 752 in series constitute an auxiliary isolation capacitor. Other components are similar to the isolation circuit as shown in FIG. 5 and are not described in detail hereinafter.

In some embodiment, the first primary isolation capacitor 711 and the second primary isolation capacitor 712 are disposed in different die, and the first auxiliary isolation capacitor 751 and the second auxiliary isolation capacitor 752 are disposed in different dies. For example, the first primary isolation capacitor 711 and the first auxiliary isolation capacitor 751 may be disposed on the first die, and the second primary isolation capacitor 712 and the second auxiliary isolation capacitor 752 may be disposed on the second die. Therefore, the isolation circuit could have a higher isolation voltage and the isolation circuit can be designed with a more flexibility.

In some embodiment, the first primary isolation capacitor 711 and the second primary isolation capacitor 712 have a same capacitance value; and the first auxiliary isolation capacitor 751 and the second auxiliary isolation capacitor 752 have a same capacitance value.

The isolation circuits in the above embodiments provides a one channel isolation circuit. In some embodiment, there may provide two or more channels, so that data transmitting rate can be improved.

In a multi-channel isolation circuit, the isolation module includes two or more primary isolation branches corresponding to the two or more channels respectively, and each of which includes a primary isolation capacitor and a first division capacitor in series. The latch module includes two or more latches, corresponding to the two or more primary isolation branches respectively. The amplifier module includes two or more amplifiers, corresponding to the two or more latches respectively. The buffer module includes two or more buffers, corresponding to the two or more primary isolation branches respectively.

In some embodiment, the isolation module further includes a common mode branch to reduce a common mode noise, and to output a common mode signal to each of the two or more latches correspondingly. All channels share the same common mode branch.

In some embodiment, the common mode branch includes an auxiliary isolation capacitor and a second division capacitor in series. a first plate of the auxiliary isolation capacitor is coupled with a ground signal of the first die, a first plate of each of the two or more of division capacitors and a first plate of the second division capacitor are coupled with a ground signal of the second die, and a second plate of the second division capacitor is coupled with an input terminal of each of the two or more latches correspondingly.

Figure 8:
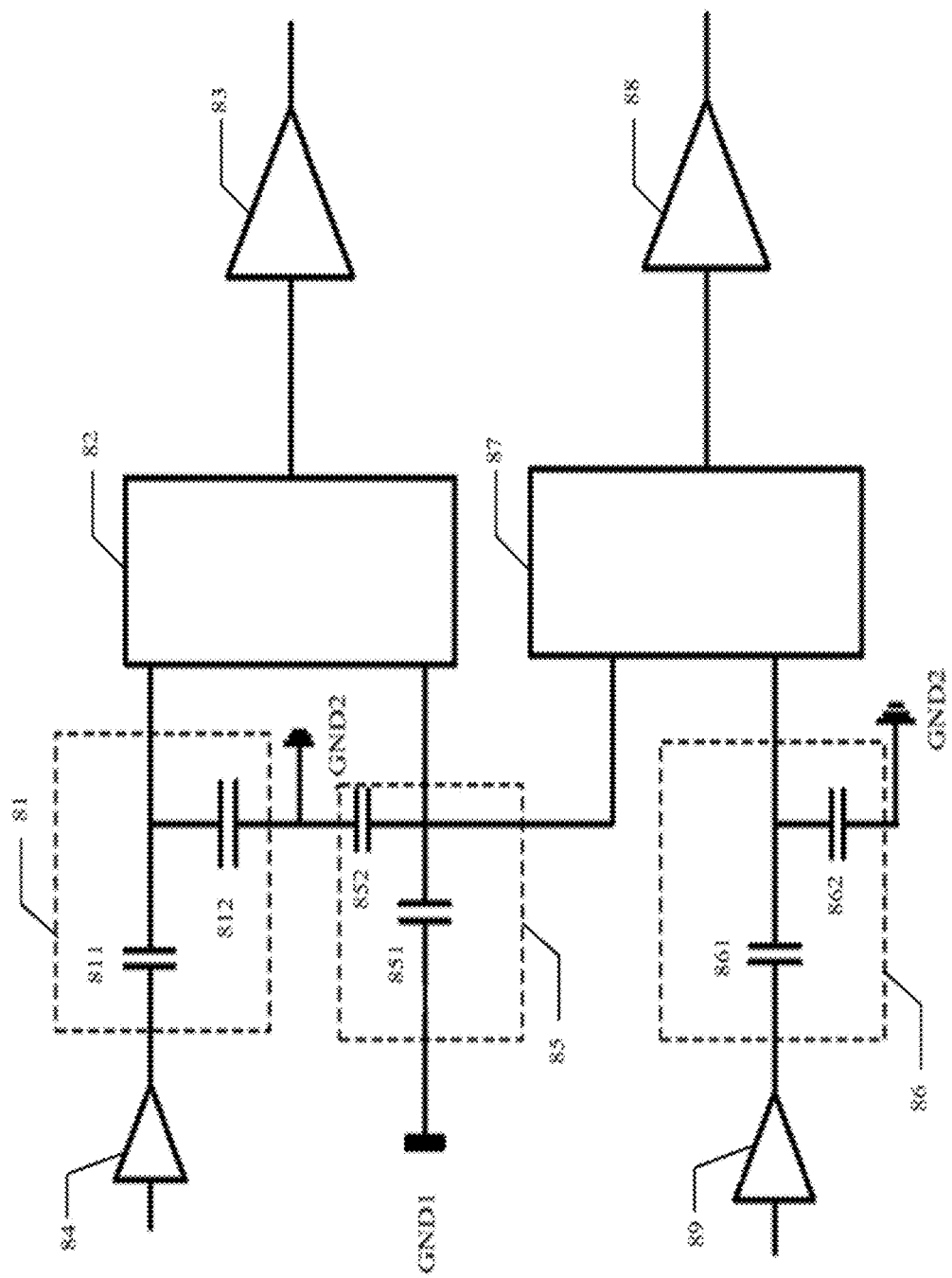
FIG. 8 schematically illustrates a diagram of an isolation circuit according to another embodiment of the present disclosure.

Referring to FIG. 8, FIG. 8 schematically illustrates a diagram of an isolation circuit according to another embodiment of the present disclosure. The isolation circuit includes an isolation module including a first primary isolation branch 81 and a common mode branch 85, a first latch 82, a first amplifier 83, and a first buffer 84. The primary isolation branch 81 includes a first primary isolation capacitor 811 and a first division capacitor 812 in series. The common mode branch includes an auxiliary capacitor 851 and a second division capacitor 852 in series.

The isolation circuit as shown in FIG. 8 further includes a second channel including a second primary isolation branch 86, a second latch 87, a second amplifier 88, and a second buffer 89. The primary isolation branch 86 includes a second primary isolation capacitor 861 and a third division capacitor 862 in series. Therefore, the isolation circuit as shown in FIG. 8 may transmit signals through the first channel of the first primary isolation branch 81 and the common mode branch 85, and through the second channel of the second primary isolation branch 86 and the common mode branch 85 at a same time.

Specifically, the primary isolation capacitor 861 includes a first plate coupled with an output terminal of the buffer 89, and a second plate coupled with a second plate of the first division capacitor 862 and a first input terminal of the latch 87. A first plate of the first division capacitor 862 receive a ground signal from second die GND2. The latch 87 includes a second plate to receive a common mode signal from the common mode branch 85 and an output terminal to output a latched signal to the amplifier 88. Capacitance values of the capacitor 811, the capacitor 812, the capacitor 851, the capacitor 852, the capacitor 861 and the capacitor 862 are denoted by C1-C6 respectively.

In some embodiment, a capacitance ratio between the primary isolation capacitors and corresponding division capacitors in each primary isolation branch is equal to a capacitance ratio between an auxiliary isolation capacitor and a corresponding second division capacitor. That is to say, in the isolation circuit as shown in FIG. 8, C1:C2=C3:C4=C5:C6.

In some embodiment, the primary isolation capacitors in the two or more primary isolation branches and the auxiliary isolation capacitor 851 have a same capacitance value; and the first division capacitors in the two or more primary isolation branches and the second division capacitor 852 have a same capacitance value. That is to say, in the isolation circuit as shown in FIG. 8, C1=C3=C5; C2=C4=C6.

In some embodiment, the isolation circuit may further include more channels.

Since capacitors are silicon dioxide devices, there is no aging problem of the optocoupler. Further, the isolation circuit provides isolation by means of isolating capacitors, so that the input signal can directly pass through an isolation medium. Therefore, the isolation circuit has a stable quality, a long service life and a low cost.

Figure 9:
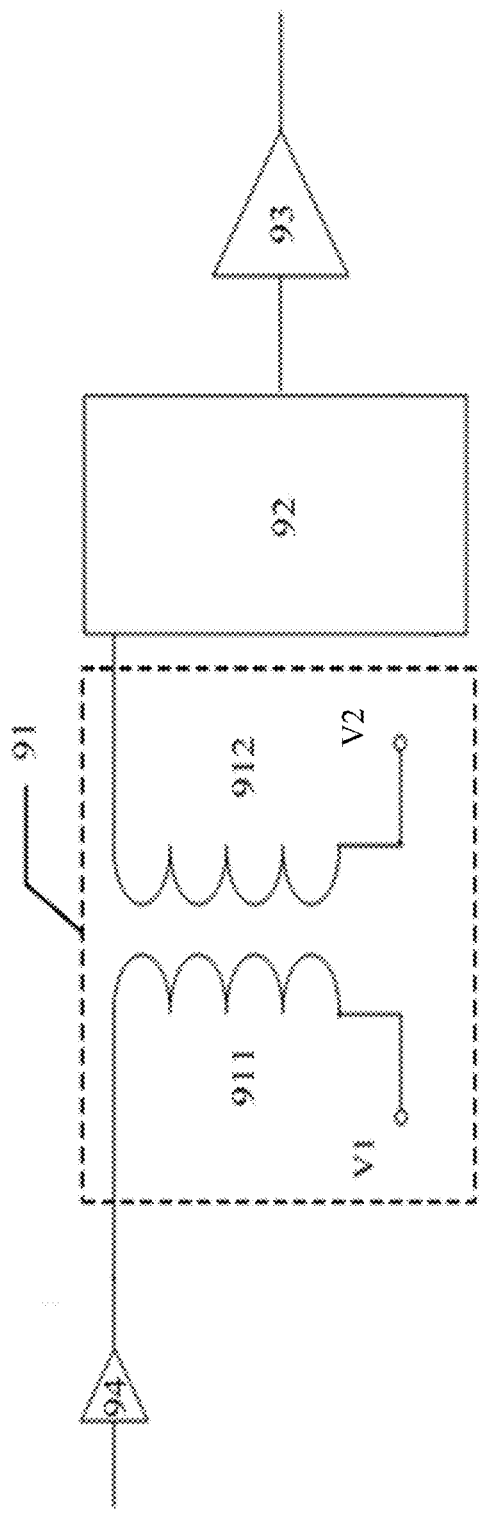
FIG. 9 schematically illustrates a diagram of an isolation circuit according to another embodiment of the present disclosure.

Referring to FIG. 9, FIG. 9 schematically illustrates a diagram of an isolation circuit according to another embodiment of the present disclosure. The isolation circuit includes an isolation module including a primary isolation branch 91, a latch 92, an amplifier 93 and a buffer 94. The isolation module shown in FIG. 8 includes a first inductor 911 and a second inductor 912. There is no electrical connect between the first inductor 911 and the second inductor 912, and signals are transmitted though a magnetic field, so that an electrical isolation can be realized. The latch 92 is required to latch the isolation signal at a certain level and outputs a latched signal. The isolation signal in a inductive isolation module is a current signal.

The first inductor 911 includes a first terminal coupled with an output terminal of the buffer 94 to receive the input signal, and a second terminal to coupled with a fixed voltage V1. The second inductor 912 includes a first terminal coupled with a first input terminal of the latch 92 to output the isolated signal to the latch module, and a second terminal coupled with the fixed voltage V2. The amplifier 93 are similar to that in the isolation circuit above and are not described in detail hereinafter.

Figure 10:
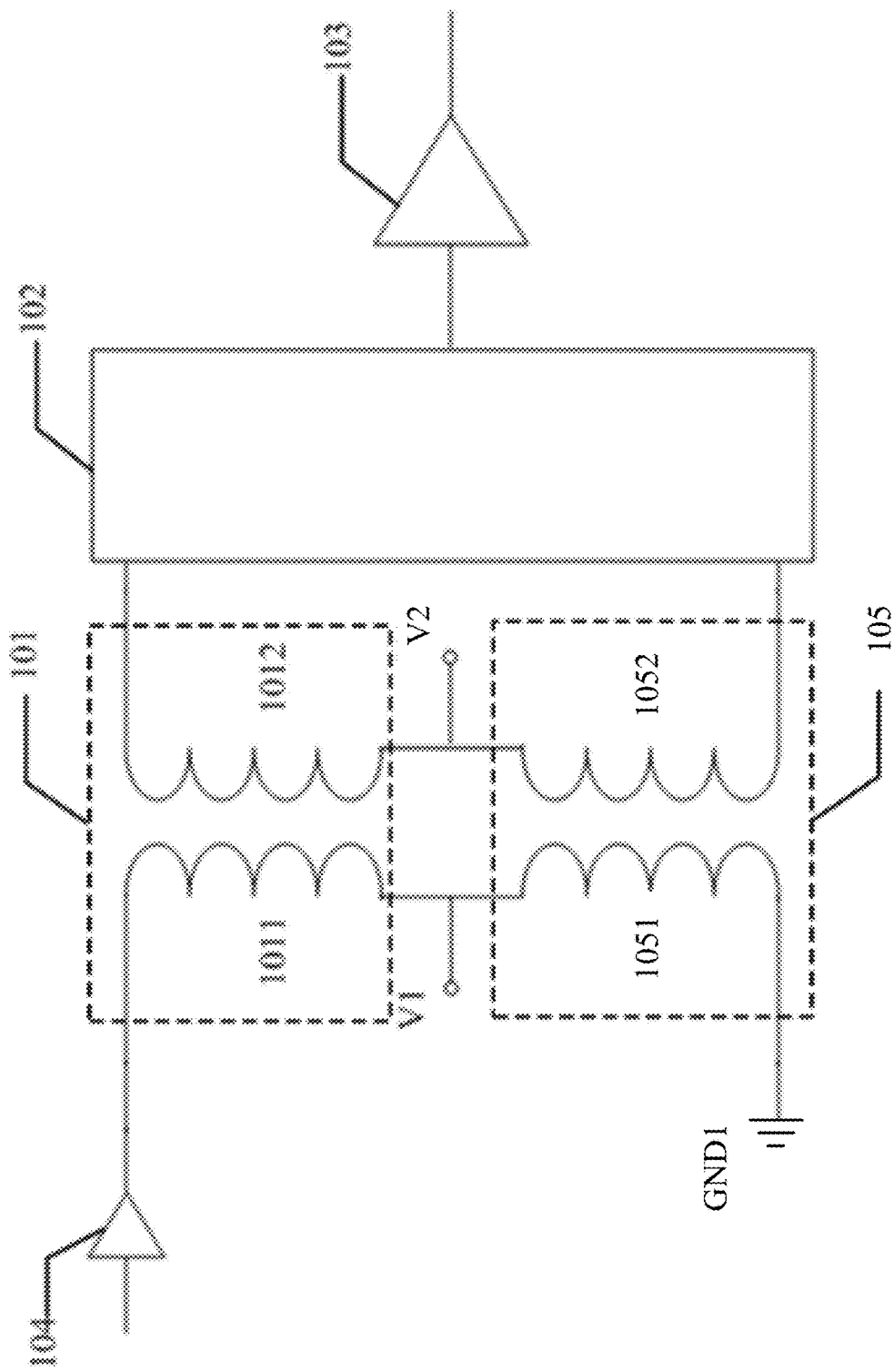
FIG. 10 schematically illustrates a diagram of an isolation circuit according to another embodiment of the present disclosure.

Referring to FIG. 10, FIG. 10 schematically illustrates a diagram of an isolation circuit according to another embodiment of the present disclosure. The isolation circuit includes an isolation module including a primary isolation branch 101 and a common mode branch 105, a latch 102, an amplifier 103, and a buffer 104. The primary isolation branch 101 includes a first inductor 1011 and a second inductor 1012.

Compared with FIG. 9, the isolation circuit in FIG. 10 further includes the common mode branch 105. The common mode branch 105 is coupled to a ground signal GND1 of the first die and an input terminal of the latch 102 to reduce a common mode noise on the first die and the second die, and to output a common mode signal to the latch 102. Specifically, the common mode branch 116 includes a third inductor 1051, and a fourth inductor 1052. The third inductor 1051 includes a first terminal to receive the ground signal GND1 of the first die, and a second terminal coupled with the fixed voltage V1. The fourth inductor 1052 includes a first terminal to output a common mode signal to the latch 102, and a second terminal coupled with the fixed voltage V2. In some embodiment, the latch 102 may be a current latch. Other components are similar to the isolation circuit as shown in FIG. 9 and are not described in detail hereinafter.

Figure 11:
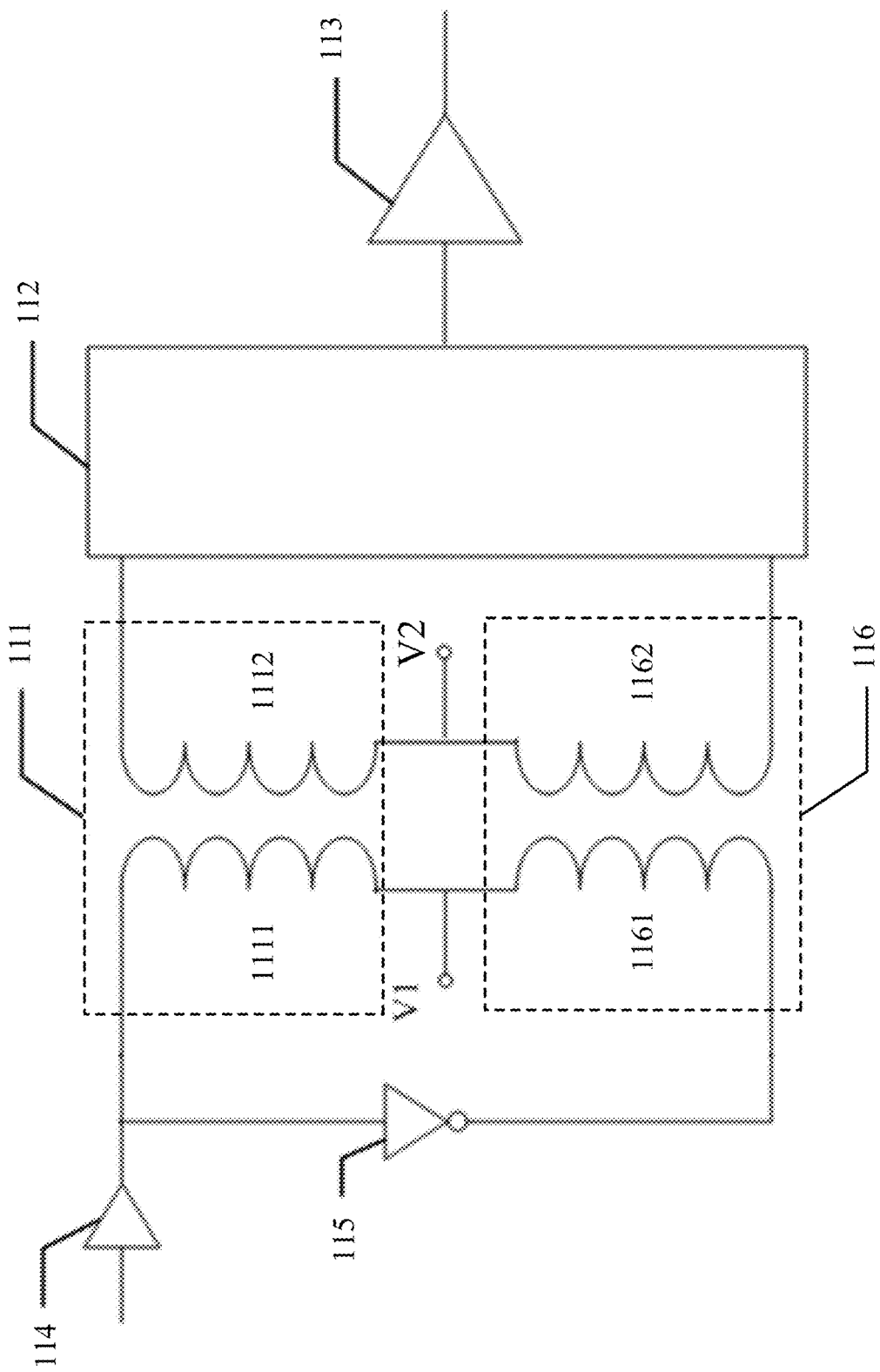
FIG. 11 schematically illustrates a diagram of an isolation circuit according to another embodiment of the present disclosure.

Referring to FIG. 11, FIG. 11 schematically illustrates a diagram of an isolation circuit according to another embodiment of the present disclosure. The isolation circuit includes an isolation module including a primary isolation branch 111 and a common mode 1f branch 116, a latch 112, an amplifier 113, a buffer 114 and an inverter 115. The primary isolation branch 111 includes a first inductor 1111 and a second inductor 1112.

Compared with FIG. 9, the isolation circuit in FIG. 11 further includes the inverter 115 and the common mode branch 116. The inverter 115 is configured to invert the input signal to an inverted input signal, and includes an input terminal coupled with the input signal, and an output terminal to output the inverted input signal. The common mode branch 116 is to reduce a common mode noise on the first die and the second, and to output a common mode signal to the latch 112. Specifically, the common mode branch 116 includes a third inductor 1161, and a fourth inductor 1162. The third inductor 1161 includes a first terminal to receive the inverted input signal, and a second terminal coupled with the fixed voltage V1. The fourth inductor 1162 includes a first terminal to output a common mode signal to the latch 112, and a second terminal coupled with the fixed voltage V2. Other components are similar to the isolation circuit as shown in FIG. 9 and are not described in detail hereinafter.

In some embodiment, the fixed voltage V1 and the fixed voltage V2 may be VDD or ½ VDD or other values.

In some embodiment, the latch module includes at least one latch, each of which has a flipping voltage 10 mV~60 mV or a flipping current at 30 uA~1 mA corresponding to voltage signals or current signals respectively.

Figure 12:
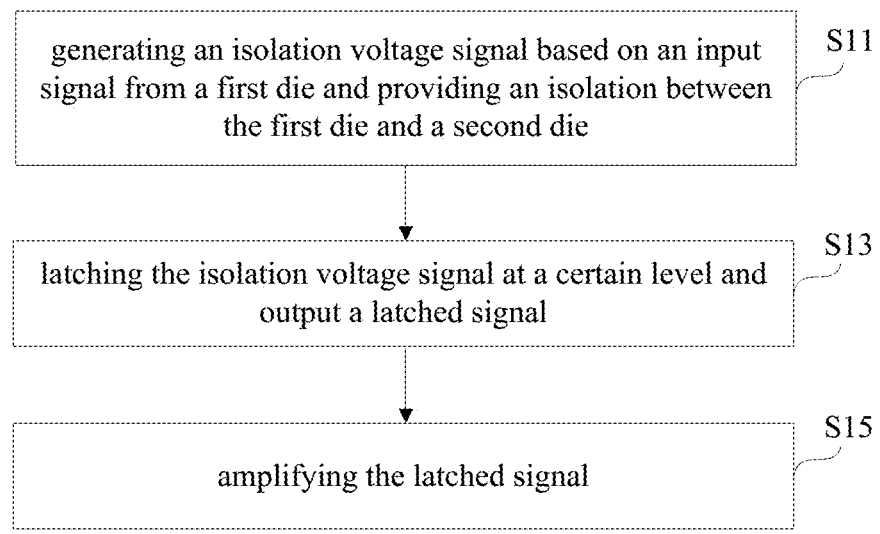
FIG. 12 schematically illustrates a flowchart of a method for providing isolation between two dies according to an embodiment of the present disclosure.
Figure 13:
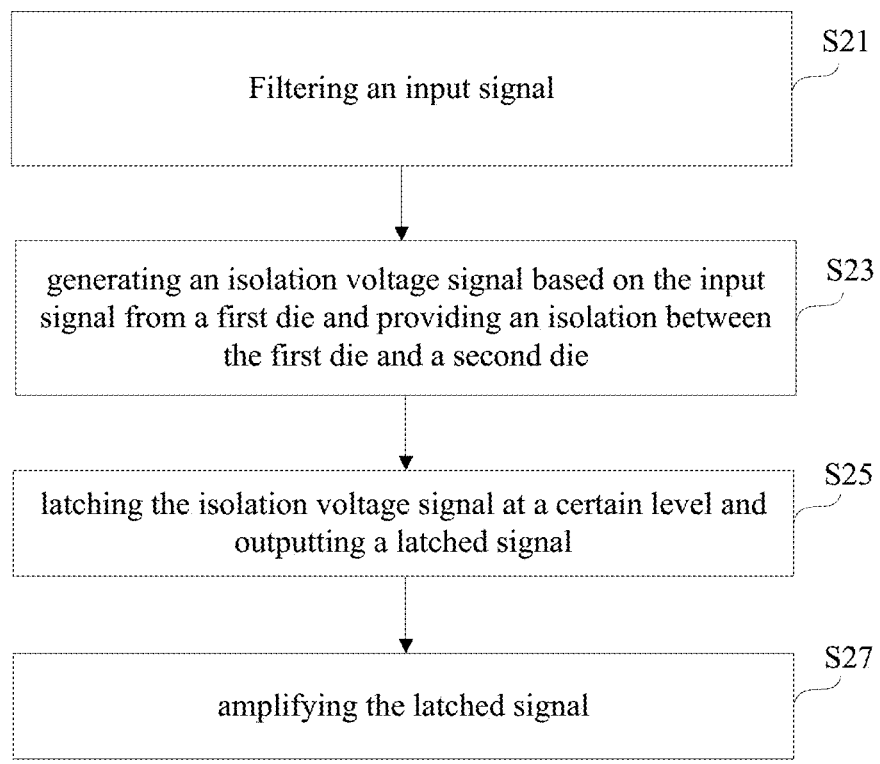
FIG. 13 schematically illustrates a flowchart of a method for providing isolation between two dies according to another embodiment of the present disclosure.

Embodiments of the present disclosure further provides a method for providing isolation between two dies. FIG. 12 schematically illustrates a flowchart of a method for providing isolation between two dies according to an embodiment of the present disclosure; and FIG. 13 schematically illustrates a flowchart of a method for providing isolation between two dies according to another embodiment of the present disclosure.

As shown in FIG. 12, and the method includes S11, S13 and S15.

In S11: an isolation signal is generated based on an input signal from a first die and providing isolation between the first die and a second die, wherein the isolation signal is smaller than the input signal in amplitude.

In S13: the isolation signal is latched at a certain level to form a latched signal.

In S15: the latched signal is amplified.

In some embodiment, the method further includes a filtering step. As shown in FIG. 13, the method for isolating two dies including S21, S23, S25 and S27. In S21, an input signal is filtered before the isolation voltage is generated. Other steps of S23, S25 and S27 are similar to corresponding steps in FIG. 12. The method in FIGS. 12 and 13 may be implemented in any systems including the isolation circuit according to an embodiment of the present disclosure. More details of the method may refer to description of the isolation circuit, and are not described in detail hereinafter.

Although the present disclosure has been disclosed above with reference to preferred embodiments thereof, it should be understood that the disclosure is presented by way of example only, and not limitation. Those skilled in the art can modify and vary the embodiments without departing from the scope of the present disclosure.

What is claimed is:

1. An electrical circuit comprising:
   an input buffer configured for receiving an input voltage, the input voltage being characterized by a first voltage, the input buffer being positioned on a first die;
   an inverter coupled to the input buffer, the inverter being configured to output an inverted input voltage;
   a first primary capacitor coupled to the input buffer;
   a division capacitor coupled to the first primary capacitor and a ground terminal;
   a common mode branch coupled to the ground terminal and the inverter, the common mode branch being configured to receive the inverted input voltage from the inverter;
   a latch comprising a first input terminal, a second input terminal, and an output terminal, the first input terminal of the latch being coupled to the division capacitor, the second input terminal of the latch being coupled to the common mode branch; and
   an amplifier coupled to the output terminal of the latch and configured to receive a latched signal and amplify the latched signal.

2. The electrical circuit of claim 1 wherein the input buffer is further configured for filtering the input signal.

3. The electrical circuit of claim 1 further comprising a second primary capacitor configured in series relative to the first primary capacitor.

4. The electrical circuit of claim 3 wherein the second primary capacitor is positioned on a second die.

5. The electrical circuit of claim 1 wherein the electrical circuit is characterized by a leakage current at a picoampere level, and the first primary capacitor is configured to maintain a voltage at a millisecond level.

6. The electrical circuit of claim 1 wherein the first primary capacitor is positioned on the first die.

7. The electrical circuit of claim 1 wherein the first primary capacitor is partially positioned on the first die and partially positioned on a second die.

8. The electrical circuit of claim 1 wherein the amplifier generates an output signal based on the latched signal, the output signal being characterized by a third voltage, the third voltage level being greater than the second voltage.

9. The electrical circuit of claim 1 wherein the latch comprises a flipping voltage.

10. The electrical circuit of claim 1 wherein the amplifier generates an output signal based on the latched signal, the output signal being characterized by a third voltage, the third voltage level being substantially equal to the first voltage.

11. The electrical circuit of claim 1 wherein the common mode branch comprises an auxiliary capacitor.

12. The electrical circuit of claim 1, wherein the latch comprises a voltage latch.

13. An electrical circuit comprising:
  an input buffer configured for receiving an input voltage, the input voltage being characterized by a first voltage, the input buffer being positioned on a first die;
  a first primary isolation capacitor coupled to the input buffer;
  a first division capacitor coupled to the first primary capacitor;
  a common mode branch comprising an auxiliary isolation capacitor and a second division capacitor, the auxiliary isolation capacitor comprising a first plate coupled to a first ground terminal of the first die, the second division capacitor comprising a first plate coupled to a second ground terminal of a second die, the common mode branch being configured to output a common mode signal to reduce a common mode noise on the first die and the second die.

14. The electrical circuit of claim 13, wherein the input voltage received at the input buffer is lower than or equal to 20,000 V relative to the second ground terminal of the second die.

15. The electrical circuit of claim 13, wherein a first capacitance ratio between the first primary isolation capacitor and the first division capacitor is substantially equal to a second capacitance ratio between the auxiliary isolation capacitor and the second division capacitor.

16. The electrical circuit of claim 15, wherein the first capacitance ratio between the first primary isolation capacitor and the first division capacitor is 1:10.

17. The electrical circuit of claim 13, wherein the first primary isolation capacitor is characterized by a first capacitance value, the auxiliary isolation capacitor is characterized by a second capacitance value, the first capacitance value is substantially equal to the second capacitance value.

18. The electrical circuit of claim 13, wherein the first division capacitor is characterized by a third capacitance value, the second division capacitor is characterized by a fourth capacitance value, the third capacitance value is substantially equal to the fourth capacitance value.

* * * * *